United States Patent [19]

Yeager et al.

[11] Patent Number: 5,802,583
[45] Date of Patent: Sep. 1, 1998

[54] SYSYEM AND METHOD PROVIDING SELECTIVE WRITE PROTECTION FOR INDIVIDUAL BLOCKS OF MEMORY IN A NON-VOLATILE MEMORY DEVICE

[75] Inventors: Michael W. Yeager; Jeffery E. Downs, both of Colorado Springs, Colo.; Yoshihiko Yasu, Tokyo-to, Japan

[73] Assignees: Ramtron International Corporation, Colorado Springs, Colo.; Hitachi Ltd., Tokyo, Japan

[21] Appl. No.: 745,581

[22] Filed: Oct. 30, 1996

[51] Int. Cl.$^6$ .................................................. G06F 12/00
[52] U.S. Cl. ................... 711/152; 711/104; 711/152; 711/163; 365/195; 365/189.01; 365/189.05; 365/230.03; 365/230.05; 365/230.06; 365/230.08; 365/239
[58] Field of Search ........................... 711/104, 163, 711/152; 365/195, 230.03, 189.05, 230.08, 230.06, 239, 189.01, 230.45

[56] References Cited

U.S. PATENT DOCUMENTS

| | | | |
|---|---|---|---|
| 5,394,367 | 2/1995 | Downs et al. | 365/190 |
| 5,426,075 | 6/1995 | Perino et al. | 438/3 |
| 5,604,881 | 2/1997 | Thomas | 711/104 |
| 5,666,760 | 9/1997 | Hazen | 365/189.01 |
| 5,673,222 | 9/1997 | Fukumoto et al | 365/185.04 |

OTHER PUBLICATIONS

Electronic Industries Association Engineering Department, JEDEC Standard No. 21–C Release 6, Configurations for Solid Sate Memories, Jan. 1996, pp.1–1—4–97.
Ramtron International Corporation, FM1608S FRAM® Memory, Feb. 1994, pp.3–8.
Ramtron International Corporation; FRAM Memory Products 1996 Databook pp. 1–17 to 1–25;FM1808S® FRAM Memory, 262,144–Bit Nonvolatile Ferroelectric RAM Product Preview.

*Primary Examiner*—Tod R. Swann
*Assistant Examiner*—Mehdi Namazi
*Attorney, Agent, or Firm*—William J. Kubida, Esq.; Richard J. Holzer, Esq.; Holland & Hart, LLP

[57] ABSTRACT

A system and method for selective write protection for a non-volatile memory device which comprises a superset of the existing JEDEC 21-C standard and in which user definable portions of a non-volatile memory device can be write protected instead of only the entire device. The write-protection technique of the present invention can be selectably enabled or disabled dynamically as determined by a user. Moreover, the system and method of the present invention provides for storage of the device write-protection configuration in non-volatile memory in order that the device can be restored to its last known write-protection state in the event it is powered down or the current configuration is otherwise lost.

19 Claims, 2 Drawing Sheets

SYSYEM AND METHOD PROVIDING SELECTIVE WRITE PROTECTION FOR INDIVIDUAL BLOCKS OF MEMORY IN A NON-VOLATILE MEMORY DEVICE

CROSS REFERENCE TO RELATED PATENT APPLICATIONS

The subject matter of the present invention is related to the subject matter disclosed in U.S. Pat. No. 5,394,367 issued Feb. 28, 1995 to Jeffrey E. Downs and Michael W. Yeager for: "System and Method for Write-Protecting Predetermined Portions of a Memory Array" assigned to Ramtron International Corporation, Colorado Springs, Colo., the disclosure of which is herein specifically incorporated by this reference.

BACKGROUND OF THE INVENTION

The present invention relates, in general, to the field of system and methods for selective write protection for a non-volatile memory device and a memory device for use in conjunction with the same. More particularly, the present invention relates to a selective write protection technique that provides user selectable write protection for specific memory blocks in a non-volatile memory device.

The Electronics Industry Association ("EIA") and the Joint Electron Device Engineering Counsel ("JEDEC") have published an engineering standard 21-C relating to certain configurations for solid-state memory devices. In this regard, the JEDEC 21-C standard for non-volatile memory devices such as read only memory ("ROM"), electrically programmable read only memory ("EPROM"), ferroelectric random access memory ("FRAM®", a registered trademark of Ramtron International Corporation) and the like allows only for the provision of write-protection (that is, subsequent writes are precluded to the memory device array as a whole) but does not address the possibility of write-protecting less than all of the available memory blocks of the device memory array. Moreover, the existing JEDEC 21-C write protection technique does not allow a user to recall previous states of the write protection configuration of the non-volatile memory device.

Basically the JEDEC 21-C standard provides for a specified sequence of seven (7) addresses, which when applied to the memory device in the proper sequential order, place the device into either a write-protected mode or into an unprotected mode. Upon power-up, the device is initially placed in a reset state and the entire memory device is writeprotected. Thereafter, every subsequent access to the device is monitored since the specified sequence of addresses may occur at any time thereafter. If only a partial sequence is detected, or if the access mode (i.e. a "read" instead of a "write") is not correct, the sequence is considered to be invalid.

As opposed to the JEDEC 21-C standard in which the entire device memory array is either write-protected or not write-protected, U.S. Pat. No. 5,394,367 discloses a novel system and method for write-protecting predetermined portions of a memory array. In the embodiment disclosed, a predetermined "soft fuse value" may be written to a corresponding soft fuse register within a non-volatile memory device. Subsequent access to a number of lock bits are thereby controlled such that any number of "writes" to predetermined portions of an associated memory array are allowed until such time as the predetermined soft fuse value is written into the soft fuse register, whereupon the corresponding lock bits are thereafter set and further "writes" to the same predetermined portions of the memory array are thereafter precluded. Once the lock bits are set, they cannot be "un-set" thereafter.

SUMMARY OF THE INVENTION

Disclosed herein is a system and method for selective write protection for a non-volatile memory device which comprises, in essence, a superset of the existing JEDEC 21-C standard in which user definable portions of a non-volatile memory device can be write protected instead of only the entire device. The write-protection technique herein disclosed can be selectably enabled or disabled dynamically as determined by a user. Moreover, the system and method of the present invention provides for storage of the device write-protection configuration in non-volatile memory in order that the device can be restored to its last known write-protection state in the event the current configuration information is somehow lost.

The system and method of the present invention provides for a conventional JEDEC 21-C compliant write-protection scheme wherein when a non-volatile memory device is initially "powered up", the entire device defaults to a write-protected state. However, should the user wish to change the write protection from the entire device memory array to a selected subset of memory blocks in the array, a special mode may be invoked. In a preferred embodiment disclosed herein, this special mode is invoked by serially appending an address (e.g. 040F hexadecimal) to the standard 7 JEDEC 21-C disable write protection sequence. If a "write" is performed on this additional 8th cycle, the byte of data on the input/output ("I/O") pins of the device is written into both a write protection register and non-volatile memory. The write protection register contains information as to which particular memory blocks are write protected within the device memory array. On the other hand, if a "read" operation is performed on the additional "8"th cycle, the write protection register is updated with the configuration byte stored in the non-volatile memory. This configuration byte allows the user to recall the latest write protection of the memory in case of power failure. If only a partial sequence of the 8 cycles is detected, or if the access mode (i.e. a "read" instead of a "write") is not correct, the sequence is considered to be invalid.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
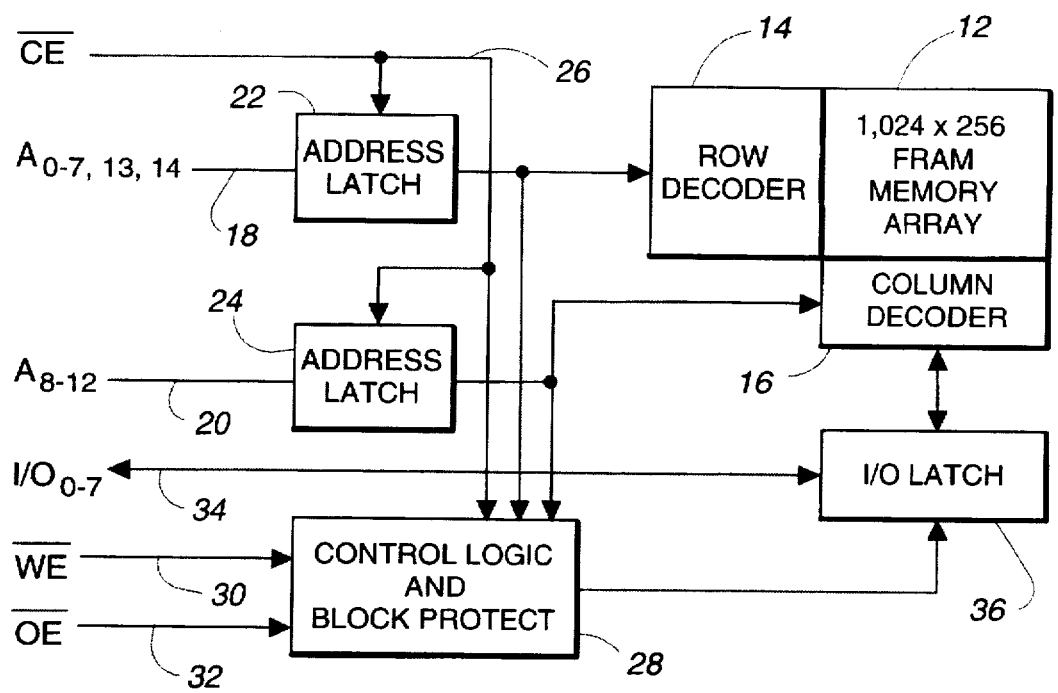
FIG. 1 is a functional block diagram of an exemplary non-volatile memory device, in this instance a 32K×8 FRAM integrated circuit, useful for illustrating a possible implementation of the system and method for selective write protection of the present invention.

With reference now to FIG. 1, a non-volatile memory 10 is shown comprising a FRAM memory device integrated circuit available from Ramtron International Corporation. In the embodiment disclosed herein, the memory 10 includes a memory array 12 organized as 32K words by 8 bits which combines the read/write characteristics of conventional dynamic random access memory ("DRAM") with non-volatile storage characteristics through the use of ferroelectric dielectric storage cells which may be polarized on each read or write cycle. The ferroelectric dielectric may comprise lead zirconate titanate ("PZT"), strontium bismuth tantalate ("SBT") or other suitable ferroelectric dielectric.

The memory array 12 is accessed by means of a row decoder 14 and column decoder 16 in response to externally supplied addresses appearing on address bus 18 ($A_{0-7}$, $A_{13-14}$) and address bus 20 ($A_{8-12}$) which are then latched in respective address latches 22, 24. In addition to the output of the address latches 22, 24, an active low chip enable line 26 ("CE_") (which operatively enables the address latches 22, 24) is also supplied to a control logic and block protection register 28 as will be more fully described hereinafter.

The block protection register 28 receives external inputs on a write enable line 30 ("WE_") and an output enable line 32 ("OE_"), the function of which will also be more fully described hereinafter. The block protection register 28 also provides input to an I/O latch 36 (which is bidirectionally coupled via an internal bus to the column decoder 16) which then receives and provides external data over an I/O bus 34 ($I/O_{0-7}$)

The block protection register 28 comprises, in a preferred embodiment, at least one non-volatile storage register having individual bit storage locations each corresponding to at least one memory block of said memory array 12 and each respectively storing a given bit of a data word supplied to the input/output data bus of the memory 10 as will be more fully described hereinafter. The bit values which are stored in the individual bit storage locations of the block protection register 28 then function as "lock bits" as disclosed in the aforementioned U.S. Pat. No. 5,394,367 and the state of each lock bit determines whether write operations are allowed or precluded to the corresponding memory block (or blocks) of the memory array 12.

Figure 2:
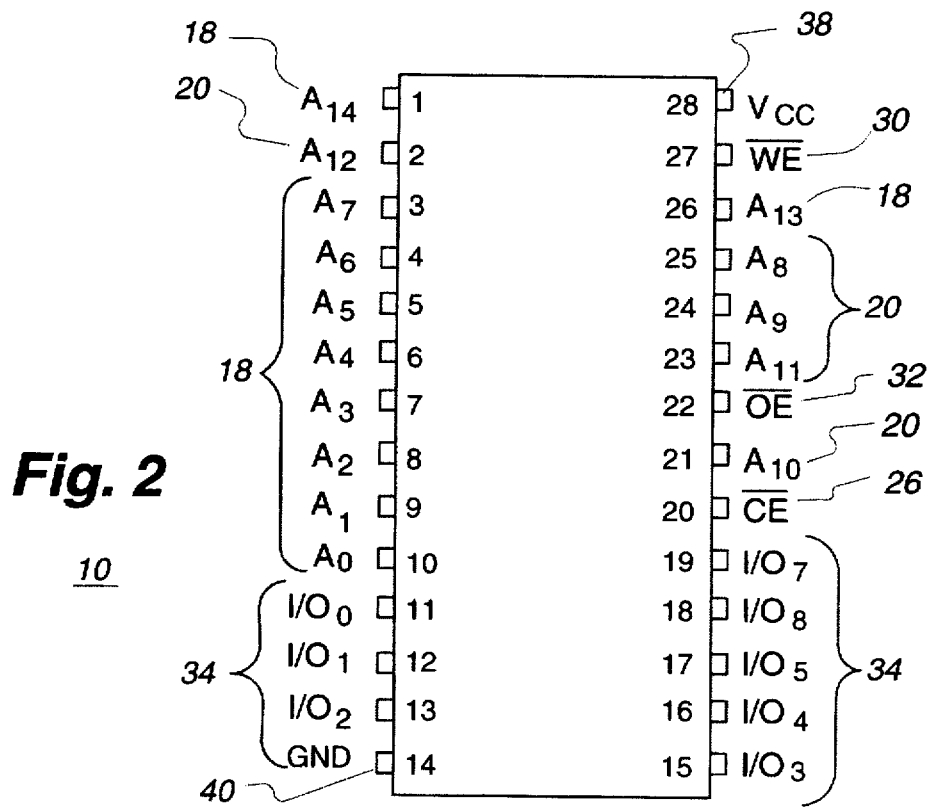
FIG. 2 is a corresponding pin configuration view of the FRAM integrated circuit of the preceding FIG. 1 further illustrating in greater detail the various input/output ("I/O") pins thereof.

With reference additionally now to FIG. 2, a possible pin configuration for the memory 10 of FIG. 1 is shown in an SOP package. In this figure, the chip enable line 26, write enable line 30, output enable line 32 as well as address buses 18, 20 and I/O data bus 34 are illustrated. Additionally, the memory 10 is also shown to include a supply voltage input 38 ($V_{cc}$) and a corresponding circuit ground input 40 (GND).

Read Operation

When the chip enable line 26 is low and the write enable line 30 is high, a read operation is performed by the non-volatile memory 10. On the falling edge of the chip enable line 26, all address bits ($A_0$–$A_{14}$) on address buses 18, 20 are latched into the address latches 22,24 and the read cycle is started. Data will appear on the I/O bus 34 a maximum access time ($t_{CE}$) after the beginning of the cycle. It is noted that there should be no address transitions from $t_{AS}$ (setup time) before the falling edge of the chip enable line 26 to $t_{AH}$ (hold time) after it. After $t_{AH}$, the inputs to the address buses 18, 20 are ignored for the remainder of the cycle. The signal on the chip enable line 26 should be generated such that undesired glitches or pulses of any duration are prevented.

After the read operation has been completed, the chip enable line 26 would be brought high for the precharge interval ($t_{PC}$). During this period, data is restored in the internal memory cells of the memory array 12 and the memory 10 is prepared for the next read or write cycle. The chip enable line 26 must cycle with each access.

The output enable line 32 may be used to avoid bus conflicts on the system bus and only when both the chip enable line 26 and the output enable line 32 are low will the memory 10 drive its outputs. Under all other circumstances, the output drivers are held in a high impedance (high Z) condition. The internal read operation is performed regardless of the state of the output enable line 32.

Write Operation

When the chip enable line 26 falls while the write enable line 30 is low, (or the write enable line 30 falls while the chip enable line 26 is low) , a write operation will be performed by the memory 10. On the falling edge of the chip enable line 26, as in the aforementioned read cycle, the address will be latched into the memory 10 with the same setup and hold requirements. As in the read cycle, the chip enable line 26 must be held high for a precharge interval ($t_{PC}$) between each access.

Data needs to be set up $t_{PS}$ minimum on the rising edge of the write enable line 30 or the chip enable line 26, which ever occurs first. Write operations take place regardless of the state of the output enable line 32. However, the output enable line 32 may need to be driven high by the system at the beginning of the cycle in order to avoid bus conflicts.

Data stored in the memory array 12 is immediately non-volatile and power may be removed from the supply voltage input 38 of the memory 10 upon completion of the precharge interval following the write operation. For improved noise immunity, a 10ns (typical) glitch protection is incorporated into the write enable signal on the write enable line 30.

Low Voltage Protection

When $V_{CC}$ on the supply voltage input 38 is below 2.4 volts (typical), all read and write operations to the memory 10 will be ignored. In those systems in which undesired signal transitions would otherwise occur on the chip enable line 26 at or above this voltage, the chip enable line 26 should be held high with a power supply monitor circuit. Alternatively, whenever $V_{cc}$ rises above 2.4 volts, either after power-up or in a low voltage condition, no read or write operation will take place until the chip enable line 26 has been high (above $V_{IH}$, the input high voltage) for at least a precharge interval ($t_{PC}$). When the chip enable line 26 is brought low, an access will start.

Write Protection

The memory 10 uses a superset of the JEDEC 21-C standard for software data protection. The standard allows for the entire memory array 12 to be protected or unprotected by means of software control. Utilizing the system and method of the present invention, the JEDEC 21-C standard has been enhanced to allow each of the 4K word blocks in the memory array 12 to be individually protected or unprotected. The protection data map is stored in the non-volatile block protection register 28. This data can be recalled at any time via the selectable write protection technique herein disclosed to restore the previously stored block protection map as will be more fully discussed hereinafter. The configuration data may also be modified utilizing the same technique of the present invention.

Stated another way, the system and method of the present invention allows for the provision of selective write protection to a non-volatile memory device (such as memory 10) and constitutes an enhancement to the standard JEDEC 21-C write protection disable sequence. In a particular embodiment described herein for purposes of illustration only, the technique allows any of eight 4K blocks in a 32K FRAM memory device (such as memory 10) to be individually protected or unprotected. In essence, this feature is enabled by adding one additional unique address to the standard JEDEC 21-C disable sequence as shown in the following Table 1.

Upon power-up, the entire memory array 12 is write protected as per the JEDEC 21-C standard. If desired, the entire memory array 12 can be unprotected by executing the JEDEC 21-C disable sequence shown in the following Table 1. The entire memory array can thereafter again be write protected by executing the JEDEC 21-C enable sequence also shown in the following Table 1. Any time these two sequences are executed, the respective operation will be performed and care should be take to ensure that these sequences of addresses (and corresponding modes) are only executed with the intention of enabling or disabling write protection to the memory 10.

TABLE 1

| JEDEC 21-C Write Protect Sequence | | | |
|---|---|---|---|
| Cycle | Disable Sequence | Enable Sequence | Mode |
| 1 | 1823 Hex | 1823 Hex | Read |
| 2 | 1820 Hex | 1820 Hex | Read |
| 3 | 1822 Hex | 1822 Hex | Read |
| 4 | 0418 Hex | 0418 Hex | Read |
| 5 | 041B Hex | 041B Hex | Read |
| 6 | 0419 Hex | 0419 Hex | Read |
| 7 | 041A Hex | 040A Hex | Read |

Figure 3:
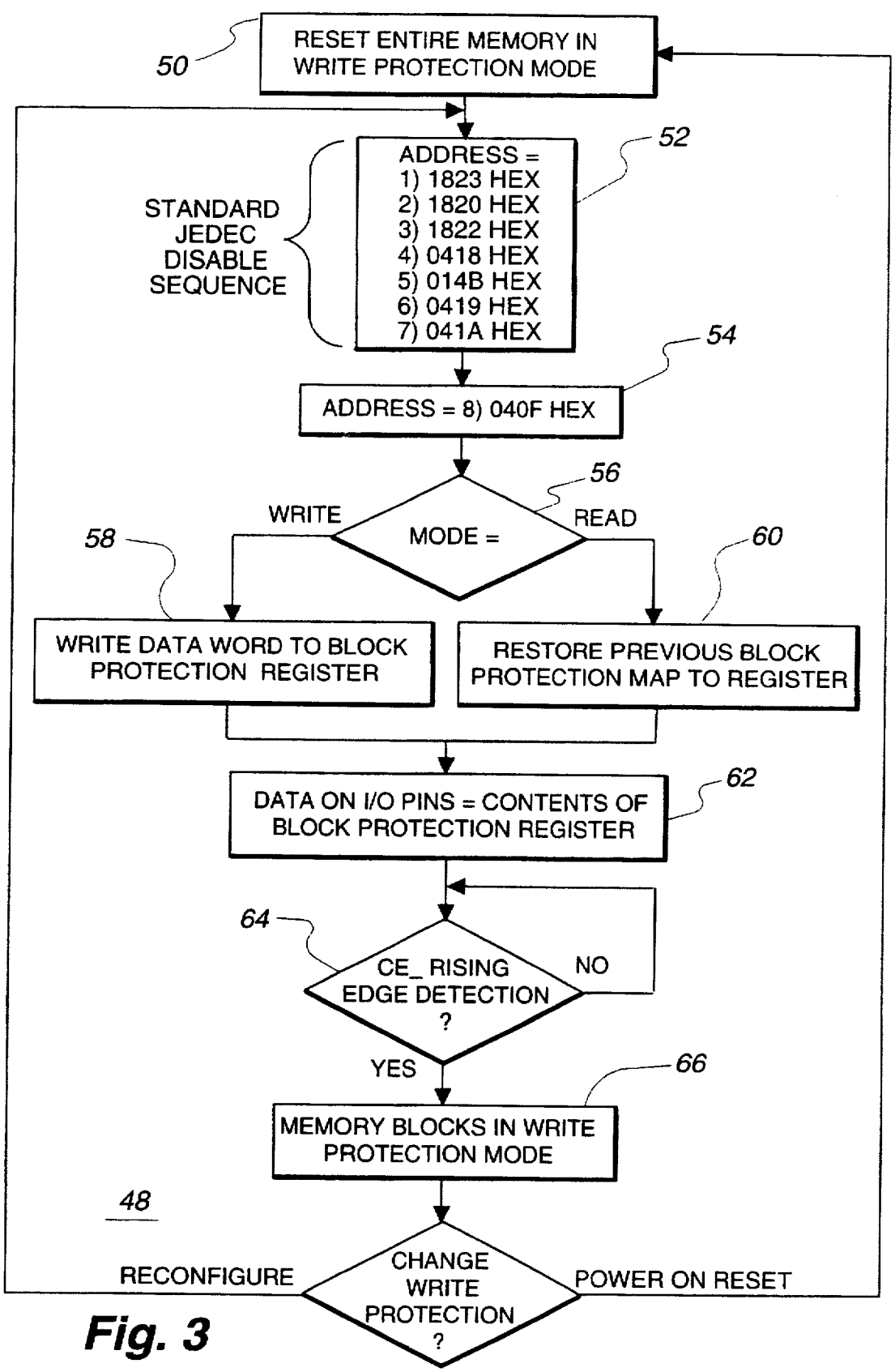
FIG. 3 is a representative logic flow chart for implementing the system and method of the present invention including an initial seven (7) step standard JEDEC 21-C write disable sequence and an additional eighth address in conjunction with either a "write" or "read" mode of operation to either write a selected data word to a non-volatile block

With reference additionally now to FIG. 3, a representative process flow 48 for the selective write protection technique of the present invention is shown. As previously noted, upon power-up, the memory 10 is placed in a reset state as shown in step 50 wherein the entire memory is in a write-protected mode. Every subsequent access to the memory 10 is monitored since the preceding sequence of seven addresses may occur at any time. If only a partial sequence is detected, or if the access mode is not correct, i.e. a "write" instead of a "read" (c.f. the preceding Table 1), the sequence is considered to be invalid and the memory 10 does not complete the JEDEC 21-C disable sequence. However, if the seven designated addresses are received in the proper sequence as shown in step 52 of FIG. 3, then the system and method of the present invention may be initiated by adding an eighth address of 040F Hex at step 54 (FIG. 3) together with either a "write" (Table 2) or a "read" (Table 3) as determined at decision step 56 and as will be more fully described hereinafter.

Specifically, in order to write a specific block protect map to the exemplary FRAM memory array, the access to this added address should be a "WRITE" access as shown in the following Table 2. This is shown in step 58 of FIG. 3.

TABLE 2

| Extended Write Protect Sequence | | | |
|---|---|---|---|
| Cycle | Sequence | I/O | Mode |
| 1 | 1823 Hex | Data | Read |
| 2 | 1820 Hex | Data | Read |
| 3 | 1822 Hex | Data | Read |
| 4 | 0418 Hex | Data | Read |
| 5 | 041B Hex | Data | Read |
| 6 | 0419 Hex | Data | Read |
| 7 | 041A Hex | Data | Read |
| 8 | 040F Hex | New Block Protect Data | Write |

If the previously configured block protection map is to be restored, then the access to 040F Hex address should be a "READ" cycle as shown in the following Table 3. This is also shown in step 60 of FIG. 3. The data on the I/O pins after an access time will be the data contained in the block protect register (step 62 of FIG. 3) that is being restored, not the data at address 040F. On the next rising edge of CE_after executing the address sequence in the preceding Table 2 or the following Table 3, (decision step 64 of FIG. 3) the selected memory blocks of the memory array 12 will be placed into the write-protected mode as shown in step 66. The memory blocks that will be write-protected will be those either written to the block protect register 28 during this sequence or those restored from the previous contents of the block protect register 28. For example, if the block protect register 28 contained the following data 10011000, addresses 3000H–4FFFH and 7000H–7FFFH would be write protected, i.e., Blocks 3, 4 and 7. As shown in decision step 68, upon power on reset, the process 48 will return to step 50 wherein the entire memory is once again write-protected. Alternatively, should it be desired to reconfigure the selective write-protection previously enabled, the process 48 may be returned to the beginning of the JEDEC 21-C standard disable sequence at step 52.

TABLE 3

| Extended Restore Protect Sequence | | | |
|---|---|---|---|
| Cycle | Sequence | I/O | Mode |
| 1 | 1823 Hex | Data | Read |
| 2 | 1820 Hex | Data | Read |
| 3 | 1822 Hex | Data | Read |
| 4 | 0418 Hex | Data | Read |
| 5 | 041B Hex | Data | Read |
| 6 | 0419 Hex | Data | Read |
| 7 | 041A Hex | Data | Read |
| 8 | 040F Hex | Restore Block Protect Data | Read |

Each bit of the data word has a one to one correlation with a specific 4K block as shown in Table 4. A data of "1" enables write protection. A data of "0" allows writing to that block. It should be noted that data written on this sequence is written to the block protect register 28 and not to the address 040F Hex.

TABLE 4

Block Number to I/O Correlation

| 4K Block Number | $A_{14}$ | $A_{13}$ | $A_{12}$ | I/O # |
|---|---|---|---|---|
| 0 | 0 | 0 | 0 | 0 |
| 1 | 0 | 0 | 1 | 1 |
| 2 | 0 | 1 | 0 | 2 |
| 3 | 0 | 1 | 1 | 3 |
| 4 | 1 | 0 | 0 | 4 |
| 5 | 1 | 0 | 1 | 5 |
| 6 | 1 | 1 | 0 | 6 |
| 7 | 1 | 1 | 1 | 7 |

On a write enable line 30 controlled write operation where the write enable line 30 rises prior to the chip enable line 26, the data I/O bus 34 will become active a $t_{WY}$ (write enable high to output driven) after the write enable line 30 rises. The data on the I/O bus 34 mirrors the data just written to the addressed location so no bus contention should arise. However, the addition of write protection requires that the I/O bus 34 perform differently if a write to a protected location in the memory array 12 was attempted. If a write operation is attempted to a protected location, the I/O outputs on the I/O bus 34 remain high impedance after the write enable line 30 returns high. This is done to prevent any bus contention that might arise due to the data driven on the I/O bus 34 externally and the data at the accessed memory location being different. The I/O outputs on the I/O bus 34 will remain high impedance until the next memory cycle.

While there have been described above the principles of the present invention in conjunction with a specific non-volatile memory device, it is to be clearly understood that the foregoing description is made only by way of example and not as a limitation to the scope of the invention. For example, the present invention is also applicable to ROMs, PROMs, EPROMS and other non-volatile memory devices. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A memory device comprising:

a memory array for storing data accessible by means of row and column decoders in response to addresses held in respective row and column address latches having as inputs an external address bus;

an input/output latch bidirectionally coupled between an external input/output bus and said memory array for storing said data to be read from or written to said memory array;

a control logic block for operatively controlling said input/output latch in response to externally supplied control signals; and a block protection register in operative association with said control logic block responsive to said row and column address latches and said externally supplied control signals for selectively enabling and disabling write operations to predetermined ones of blocks of said memory array the blocks of said memory array formed of portions of said memory array, the write operations selectively enabled and disabled in accordance with an address sequence placed on said address bus, data placed on said input/output bus and said externally supplied control signals.

2. The memory device of claim 1 wherein said memory array comprises a non-volatile memory array.

3. The memory device of claim 2 wherein said non-volatile memory array comprises a plurality of capacitive elements having a ferroelectric dielectric.

4. The memory device of claim 3 wherein said ferroelectric dielectric comprises lead zirconate titanate.

5. The memory device of claim 3 wherein said ferroelectric dielectric comprises strontium bismuth tantalate.

6. The memory device of claim 1 wherein said block protection register comprises a non-volatile storage register.

7. The memory device of claim 6 wherein said storage register includes a number of bit locations therein corresponding to each of said blocks of said memory array.

8. The memory device of claim 7 wherein write operations to each of said predetermined ones of said blocks of said memory array are precluded by writing a first data value to a corresponding one of said bit locations in said storage register.

9. The memory device of claim 7 wherein write operations to each of said predetermined ones of said blocks of said memory array are not precluded by writing a second data value to a corresponding one of said bit locations in said storage register.

10. The memory device of claim 1 wherein said address sequence comprises a JEDEC 21-C disable sequence.

11. The memory device of claim 10 wherein said address sequence further comprises an additional address immediately succeeding said JEDEC 21-C disable sequence.

12. The memory device of claim 11 wherein said additional address is substantially coincident with a write command one of said externally supplied control signals.

13. The memory device of claim 12 wherein date maintained in said input/output latch is written to said block protection register.

14. The memory device of claim 11 wherein said additional address is substantially coincident with a read command one of said externally supplied control signals.

15. The memory device of claim 14 wherein data said data values in said storage register are retrieved from said block protection register and placed in said input/output latch.

16. A method for write protecting selected ones of a plurality of blocks of memory in a memory array of an integrated circuit memory device, the plurality of blocks of memory together defining the memory of the memory array said method comprising the steps of:

performing a JEDEC 21-C standard write protection disable sequence to an external address bus and control input of said memory device;

appending an additional address to said JEDEC 21-C standard write protection sequence in conjunction with a selected mode signal to said control input; and storing a data word appearing on an external input/output bus to said memory device to a block protection register if said mode signal has a first state thereof;

precluding write operations to said selected ones of said plurality of blocks of said memory array corresponding to the value of each bit of said data word having a first value thereof, thereby write protecting said selected ones of said plurality of blocks; and allowing write operations to others than said selected ones of said plurality of blocks of said memory array corresponding to the value of each bit of said data word having a second value thereof.

17. The method of claim 16 further comprising the step of:

writing said data word to said memory array in conjunction with said step of storing said data word to said block protection register.

18. The method of claim 16 further comprising the steps of:

placing data maintained in said block protection register on said input/output bus if said mode signal has a second state thereof.

19. The method of claim 18 further comprising the step of:

writing said data maintained in said block protection register to said memory array in conjunction with said step of placing said data on said input/output bus.

* * * * *